United States Patent [19]

Hargis

[11] 4,032,858
[45] June 28, 1977

[54] AUTOMATIC FREQUENCY CONTROL SYSTEM

[75] Inventor: Robert Norman Hargis, Wheaton, Ill.

[73] Assignee: Motorola, Inc., Schaumburg, Ill.

[22] Filed: June 3, 1976

[21] Appl. No.: 692,698

[52] U.S. Cl. .................................. 331/9; 325/419; 328/155; 331/14
[51] Int. Cl.² .......................................... H03B 3/04
[58] Field of Search .......... 331/9, 14, 18; 325/419, 325/420; 328/155

[56] References Cited

UNITED STATES PATENTS

| | | | |
|---|---|---|---|
| 2,486,001 | 10/1949 | Bruck et al. | 331/9 |
| 2,790,905 | 4/1957 | Wright | 331/9 |
| 2,905,902 | 9/1959 | Strandberg | 331/9 |

Primary Examiner—John Kominski

Attorney, Agent, or Firm—James W. Gillman; Victor Myer; James P. Hamley

[57] ABSTRACT

A controllable oscillator is maintained at a center frequency $f_o$ by the inventive system. The oscillator signal is directly coupled to one input of a diode detector via a first path, and is alternately coupled, at a clock signal rate, to the second detector input via second or third paths. The second path has a selected transfer characteristic such that when it passes the oscillator signal the diode detector output is at a null. The third path includes a resonator whereby the oscillator signal passed therethrough results in a null at the detector output only when the oscillator is tuned to $f_o$. The diode detector output is then phase detected with the clock signal thus producing an output correction signal which, when integrated, is fed back to the oscillator for precise control thereof. Since the system correction is dependent solely on an AC signal, errors due to the DC characteristics of the components, e.g. the detector diodes, may be eliminated.

14 Claims, 3 Drawing Figures (A) OUTPUT 30a (C)

(B) OUTPUT 30b (D)

AUTOMATIC FREQUENCY CONTROL SYSTEM

BACKGROUND OF THE INVENTION

The present invention pertains to the electrical signal processing art and, more particularly, to a means for frequency stabilizing a signal generator.

Automatic frequency control systems are well known in the radio communications art. The function of such systems is to maintain a controllable oscillator at a selected frequency. Applications for such frequency stabilized signals include the injection oscillator of a receiver, or the carrier frequency generator in a transmitter.

A standard approach to automatic frequency control has been the use of two RF paths feeding a balanced detector. The first path couples the oscillator directly to the discriminator, while the second path passes the oscillator signal through a tuned circuit, tuned to the desired frequency of the oscillator. Since the oscillator signal coupled through the second path will be phase shifted as a function of its frequency relationship to the tuned circuit, the output from the balanced detector may be used as an error signal which, when fed back to the controllable oscillator, tends to maintain the oscillator at the selected frequency.

A serious disadvantage to the known automatic frequency control, or frequency discriminators, of the prior art is that a change in the DC characteristics of the balanced detector results in an error in the tuning of the controllable oscillator. Commonly, the balanced detector is comprised of a pair of detector diodes. Due to aging or thermal effects the diodes are known to have a varying rectification efficiency, whereby an output offset DC voltage can be expected.

Thus, the signal generating art has felt a need for a frequency stable oscillator whose stability is immune from DC drifts in its component elements, especially balanced detector drift.

SUMMARY OF THE INVENTION

It is an object of this invention, therefore, to provide an improved automatic frequency control system which provides a more stable frequency output signal.

It is a particular object of the invention to provide the above described automatic frequency control system which is immune from errors due to a DC voltage change in its components, particularly the balanced detector.

Briefly, according to the invention, the inventive automatic frequency control system maintains a controllable oscillator at a center frequency $f_o$. The system comprises a detector means which has a pair of inputs and an output. A first coupling circuit couples the controllable oscillator signal to the first detector input. Second and third coupling circuits alternately couple the oscillator signal to the second detector input in response to switching means. The second coupling circuit has a predetermined transfer characteristic selected responsive to the first coupling circuit and, preferably, results in the output from the detector being at a reference or null value when the oscillator signal is coupled through the second coupling circuit to the detector. The third coupling circuit includes a resonant component, preferably a resonator, tuned to the desired frequency $f_o$. A processing means, preferably including a phase detector and an integrator, processes the AC output signal from the detector and produces a control signal for controlling the oscillator such that it tends to stabilize at the selected frequency $f_o$. Since the control signal is derived from solely an AC signal, a DC variance, as in the detector, does not affect system accuracy.

DESCRIPTION OF THE PREFERRED EMBODIMENT OF THE INVENTION

Figure 1:
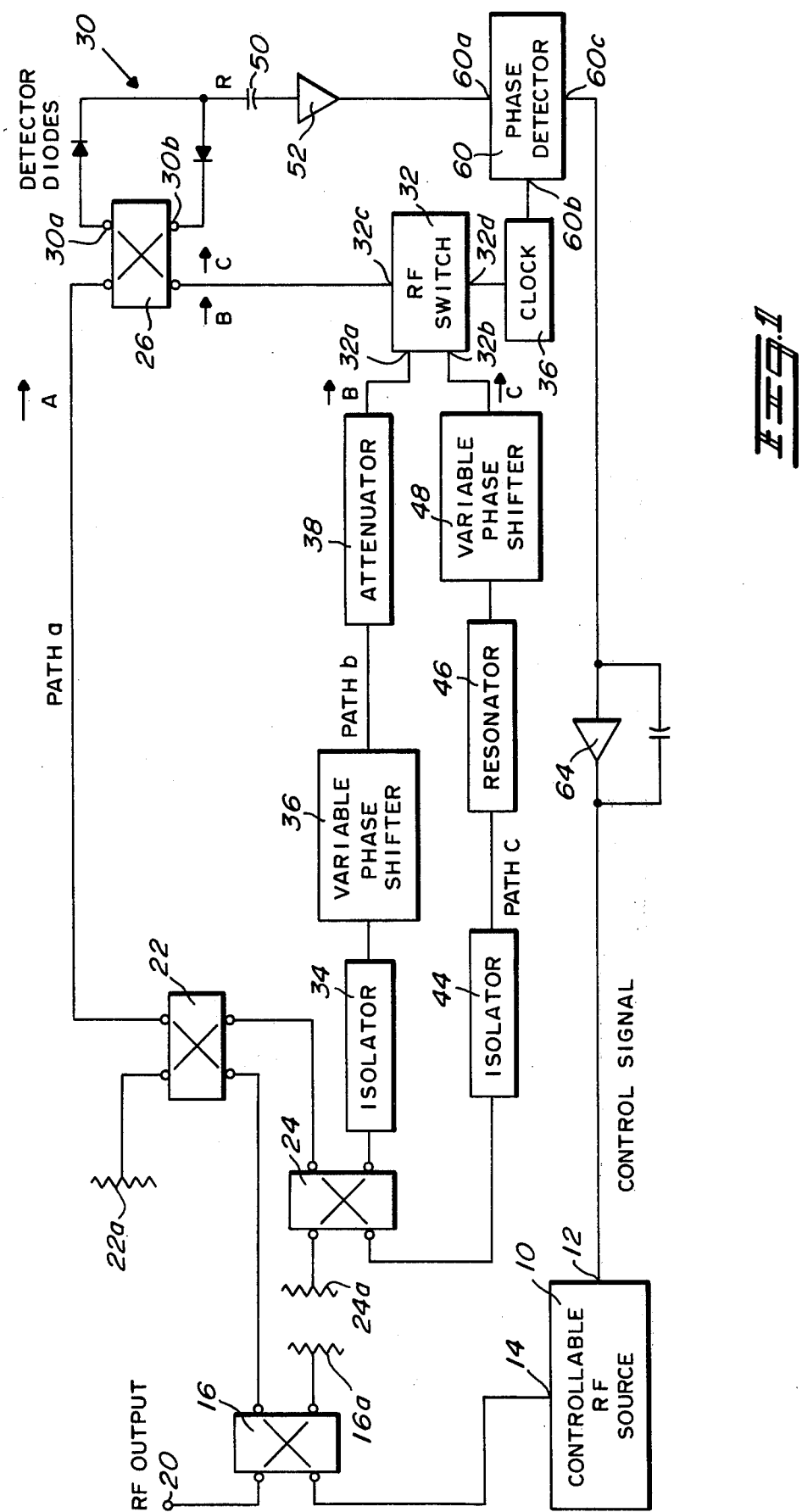
FIG. 1 is a schematic diagram of a preferred embodiment of the automatic frequency control system which uses a transmission type resonator.

Referring to FIG. 1, a controllable radio frequency (RF) source 10 has a control input 12 and an output 14. The RF source 10 responds to control signals at its control input 12 to vary the frequency of an oscillator signal appearing at the output 14. The automatic frequency control system monitors the oscillator signal at output 14 and produces a control signal at the control input 12 to stabilize the output frequency.

The output 14 of the controllable RF source 10 is routed through a directional coupler 16 to the RF output terminal 20 of the automatic frequency control system. The directional coupler 16, which is a component well known to anyone of ordinary skill in the art, couples a portion of the oscillator signal to a hybrid coupler 22, also well known in the art, and to a second hybrid coupler 24. Each coupler 16, 22, 24 is properly terminated by a load 16a, 22a and 24a respectively.

The portion of the RF oscillator signal coupled through couplers 16 and 22 is coupled over a first path, path a, through a quadrature coupler 26 to first and second inputs 30a, 30b respectively, of a diode detector pair 30. The portion of the oscillator signal which is coupled through couplers 16 and 24 is coupled over a second path, path b, to the first input 32a of a single pole double throw RF switch 32. Path b includes an isolator 34, a variable phase shifter 36, and an RF attenuator 38. The RF switch 32 has a second input 32b, and output 32c and a toggle input 32d. The RF switch 32 is a known element in the art which responds to signals at its toggle input 32d to alternately couple the first input 32a and the second input 32b to the output 32c. In this embodiment of the invention, the toggle signal is provided by a clock 36 which may be a standard square wave generator.

A third part of the oscillator signal is coupled through couplers 16 and 24 to a third path, path c. Path c includes an isolator 44, a transmission type resonator 46, and a variable phase shifter 48 which connects to the RF switch 32 second input 32b. The output of the RF switch 32c couples through the quadrature coupler 26 to the inputs 30a and 30b of the diode detector pair 30.

The detector 30 operates in the known manner to generate an output signal equal to the magnitude of the vector sum of the signals applied at its inputs 30a and 30b. This detector output is AC coupled, and DC blocked, through a capacitor 50 to an amplifier 52. The amplifier output feeds to the first input 60a of a phase detector 60. The phase detector 60 has a second input 60b and an output 60c. Operating in the known manner, the phase detector 60 produces an output signal at output 60c which is representative of the phase difference between signals applied at its input 60a and 60b. In this construction of the invention, the phase detector second input 60b is fed from the clock 36.

The phase detector 60c is integrated in a conventional integrator 64 and fed back to the control input 12 of the controllable RF source 10.

Operation of the automatic frequency control system may be understood as follows.

The transfer characteristic of path b is varied by the variable phase shifter 36 and attenuator 38 such that when the first terminal 32a of RF switch 32 is coupled to the output terminal 32c, and thereafter to the detector 30, the resultant output from the detector diodes is at a reference null, or minimum value. Similarly, the variable phase shifter 48 in path c is adjusted such that when the oscillator signal at the controllable RF source output 14 is at precisely the frequency $f_o$ of the tuned transmission resonator 46, and when the second switch input 32b couples to the switch output 32c and thereafter to the second input 30b of the detector 30 the detector output is also at its reference null, or minimum level.

Figure 3:
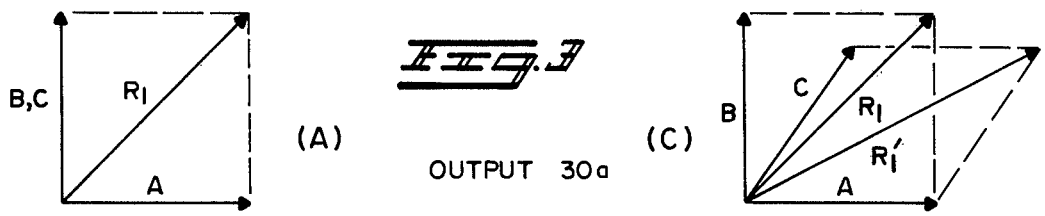
FIGS. 3a, b and c are graphic illustrations of the system operation.
Figure 3:
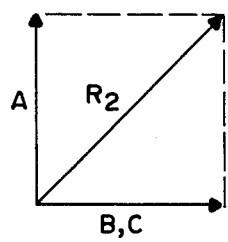
Figure 3:
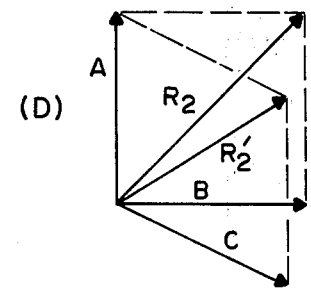
Figure 3:
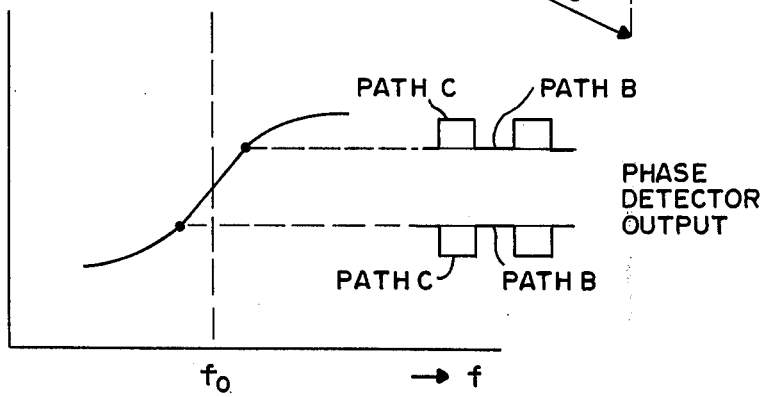

These conditions may be better understood with reference to FIG. 3a. By representing the signal components on each path a, b, c by corresponding vectors $\vec{A}$, $\vec{B}$, and $\vec{C}$, respectively, the vector diagrams of FIG. 3a may be created. During initial setup, the vector component $\vec{B}$ is adjusted to have the same magnitude as the vector component $\vec{C}$. Also, the electrical length of the path b line is adjusted by the variable phase shifter 36 to be the equivalent of the electrical length of path a. This puts vector component B in quadrature with component A at each detector diode because of the additional phase shift through the quadrature coupler 26. Also, the variable phase shifter 48 is adjusted whereby the vector component $\vec{C}$ is in quadrature with the vector $\vec{A}$ when the oscillator signal is at the same frequency as the tuning frequency of the transmission resonator 46. FIG. 3a illustrates the resultant vector $R_1$ at output 30a while FIG. 3b illustrates the resultant vector $R_2$ at output 30b. Thus, the diode detector pair 30 will produce an output reference, or null signal since the signals fed to each diode are identical.

Hence, when the oscillator signal is precisely at the same frequency as the tuning frequency of the transmission resonator 46 the output from the diode detector pair 30 does not change value as the RF switch is toggled, via clock 36, from the one switch input 32b. However, when the oscillator signal drifts off the center frequency $f_0$ of the transmission resonator 46, the resonator phase shifts the oscillator signal in accordance with the well known "S" curve.

FIGS. 3c and 3d illustrate the condition wherein the oscillator signal has drifted above the desired center frequency $f_0$. Here the vector component $\vec{C}$ is no longer in quadrature with the vector component $\vec{A}$ whereby the output resultant vector $R_1'$ at output 30a (FIG. 3c) increases in magnitude as compared to the decreased magnitude of $R_2'$ (FIG. 3d) which results from vector summation of vectors $\vec{A}$ and $\vec{C}$. This results in an inbalance at the detector diode inputs which produces an increased detector output. For the condition wherein the oscillator drifts below the center frequency $f_0$ the output from the diode detector pair assumes a more negative potential.

When the output from the detector diode pair 30 is AC coupled to capacitor 50, amplified in amplifier 52 and phase compared with the clock 36 signal in the phase detector 60, the phase detector output 60c will produce an error signal as is illustrated in FIG. 3e. As shown in the figure, for the condition wherein the vector component $\vec{C}$ is of the same magnitude, and in quadrature with the vector component $\vec{A}$, i.e. when the oscillator signal is tuned to the resonator tuned frequency $f_0$, the output from the phase detector is a constant. However, for an oscillator signal which drifts in frequency above the center frequency $f_0$ the phase detector produces a square wave output which has a zero degree phase relationship to the clock signal. As FIG. 3e illustrates the base line of the square wave corresponds to the RF switch 32 coupling path b to the phase detector, whereas the positive peaks of the phase detector output waveform c correspond to the phase detector being switched to path c.

For the condition wherein the oscillator signal drifts to a frequency lower than the center frequency $f_0$, the square wave shown in the figure, which is precisely out of phase with the clock signal square wave, is produced. Here the upper base line corresponds to the detector coupled to path b, whereas the negative peak excursion corresponds to the detector coupled to path c.

The integrator 64, operating in the known manner, produces a resultant DC signal from the phase detector output signal, which DC signal acts as a control signal to tune the controllable RF source 10 back to the center frequency $f_0$.

Of particular note is that since the correction signal is derived solely from the AC output of the detector 30, any slowly varying DC component from the dectector diodes does not affect system accuracy. A varying DC output from the detector diode pair 30 might be commonly expected as a result of a changing rectification efficiency of either one, or both of the diodes. Such a change of efficiency might result from, for example, a change in ambient temperature or aging.

Figure 2:
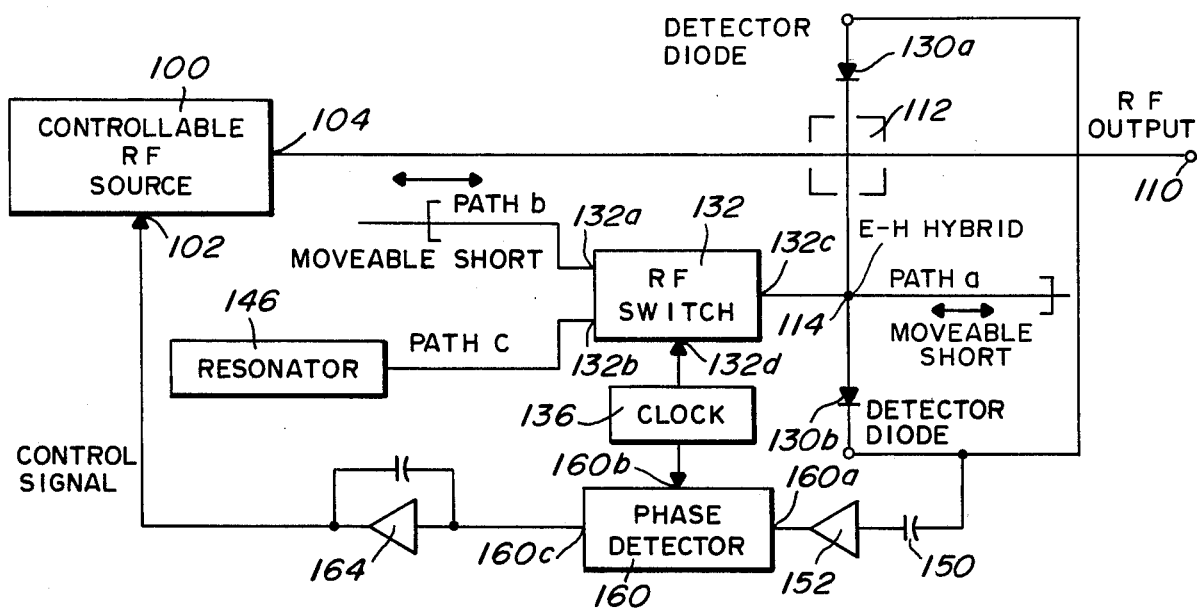
FIG. 2 is a schematic diagram of an alternate embodiment of the invention employing a reflection type resonator.

FIG. 2 illustrates an alternate construction of the inventive automatic frequency control system employing a reflective type resonator. Here, as before, a controllable RF source 100 has a control input terminal 102 and an output terminal 104. The oscillator signal appearing at the output 104 is coupled to the RF output terminal 110 of the automatic frequency control system, and through a monitor coupler 112 to a first path, path a, via an E-H hybrid 114. The E-H hybrid 114 is of the magic T type for waveguide construction, or of the 180° type for TEM or lumped circuit type hybrid construction. The E-H hybrid 114 splits the incoming signal into two basic reflective paths which are recombined and sent to the detector diodes 130a, b. An RF switch 132, having first and second inputs 132a, 132b, an output 132c, and a toggle input 132d, alternately switches the E-H hybrid 114 to either a second path, path b, or a third path, path c, which includes a reflection type resonator 146.

The output from the detector diode pair 130a,b is AC coupled through a capacitor 150, amplified in a amplifier 152 and applied to the first input 160a of a phase detector 160. A clock 136, which produces a square wave of predetermined frequency, is applied both to the toggle input 132d of the RF switch 132 and to the second input 160b of the phase detector 160. The phase detector output 160c is integrated in an integrator 164 and applied to the control input 102 of the controllable RF source 100.

Operation of the alternate embodiment of the invention shown in FIG. 2 is very similar to that of the system shown in FIG. 1. Movable shorts on the first path, path a, and the second path, path b are adjusted such that when the oscillator signal of the oscillator output 104 is precisely on the center frequency $f_0$ of the reflection type resonator 146 the detector diode pair 130a,b produces a null square wave output. The reference, or null condition occurs for a 90° phase relationship between the two reflective paths of the E-H hybrid. As the oscillator signal shifts in frequency this phase relationship varies whereby, when the RF switch is switched to path c, as with the embodiment illustrated in FIG. 1, a square wave output results from the detector diode pair 130a, b which has a zero or 180° phase relationship with the clock 136 signal depending on the direction of the frequency drift.

As with the embodiment of the invention illustrated in FIG. 1, the zero or 180° referenced square wave output from the phase detector 160 is integrated to a DC value in integrator 164 and applied to the control input 102 of the controllable RF signal source 100. This signal is of a magnitude and polarity whereby the output oscillator signal of the RF source 100 tends to stabilize at the tuning frequency of the reflection resonator 146.

As was discussed with reference to the embodiment illustrated in FIG. 1, since the output from the detector diode pair 130a, b is capacitively coupled, and thus DC blocked, via capacitor 150 to the remaining error signal processing circuitry, any DC unbalance from the detector diode pair will not affect the accuracy of the system.

In summary, alternate embodiments of an improved automatic frequency control system, having substantial immunity from errors due to DC shifts in its components, especially the detector, have been described.

While preferred embodiments of the invention have been described in detail, it should be apparent that many modifications and variations thereto are possible, all of which fall within the true spirit and scope of the invention.

I claim:

1. An automatic frequency control system for maintaining a controllable oscillator at a center frequency $f_0$ comprising:
   a detector means having a pair of inputs and an output;
   a first coupling circuit means for coupling the oscillator signal to the first detector input;
   a second coupling circuit means having a predetermined transfer characteristic selected responsive to the first coupling circuit;
   a third coupling circuit means comprising a resonant component tuned to $f_0$;
   switching means for alternately coupling the oscillator signal through the second and third coupling circuits to the second detector input; and
   processing means for processing the detector AC output and controlling the oscillator in response thereto.

2. The system of claim 1 wherein the detector means is comprised of a diode detector pair.

3. The system of claim 1 wherein the second circuit coupling means includes means for producing a reference level at the detector output when the oscillator signal is coupled through the second circuit coupling means to the detector.

4. The system of claim 1 wherein the third circuit coupling means includes means for producing a reference level at the detector output when an oscillator signal, having a frequency $f_0$, is coupled through the third coupling means to the detector.

5. The system of claim 3 wherein the third circuit coupling means includes means for producing the reference level at the detector output when an oscillator signal, having a frequency $f_0$, is coupled through the third coupling means to the detector.

6. The system of claim 1 wherein the switching means comprises:
   a clock signal generator; and
   a switch means having a pair of inputs, an output, and a toggle terminal, the switch responding to clock signals received at its toggle terminal to alternately couple each input to the output.

7. The system of claim 6 wherein the processing means comprises:
   a phase detector, having first and second inputs and an output, for producing a predetermined signal at its output representative of the phase difference between signals received at its inputs;
   means for coupling the first phase detector input to the detector output;
   means for coupling the second phase detector input to the clock signal generator;
   means for integrating the phase detector output and producing a control signal; and
   means for coupling the control signal to the controllable oscillator for controlling the frequency thereof.

8. The system of claim 7 wherein the means for coupling the first phase detector input to the detector output includes AC coupling but DC blocking means.

9. The system of claim 1 wherein the third coupling circuit means resonant component is comprised of a transmission type resonator.

10. The system of claim 1 wherein the third coupling circuit means resonant componetn is comprised of a reflection type resonator.

11. An automatic frequency control system comprising:
   a signal source means, having an output and a control input, for producing an oscillator signal, at its output, whose frequency is dependent upon control signals received at the control input;
   a detector means, having first and second inputs and an output, for producing at its output the sum of signals received at its first and second inputs, said detector subject to producing a varying DC signal at its output;
   a first electrical path means for coupling the oscillator signal to the first detector input;
   a switch means, having first and second inputs, an output, and a toggle terminal, for coupling either the first or the second input to the output dependent on a signal received at the toggle terminal;
   a clock means, coupled to the toggle terminal of the switch means, for toggling the switch means at a predetermined rate;
   means for coupling the switch output to the detector second input;
   a second electrical path means for coupling the oscillator signal to the switch first input, the second electrical path being of selected characteristics such that when the switch first input is coupled to the switch output the output from the detector means is at a reference level;

a resonate circuit means having a electrical resonance at a selected frequency;

a third electrical path means for coupling the oscillator signal through the resonate circuit means to the switch second input, the third electrical path being of selected characteristics such that when the oscillator signal is at the resonate frequency of the resonate circuit, and when the switch second input is coupled to the switch output, the output from the detector means is at the reference level;

a phase detector means, having first and second inputs an an output, for producing a predetermined control output signal representative of the phase difference between signals received at its inputs;

means for AC coupling, but DC blocking the output of the detector to the first phase detector input;

means for coupling the clock signal to the second phase detector input; and means for coupling the phase detector output to the control input of the signal source, for predeterminedly controlling the frequency of the oscillator signal produced thereby.

12. The automatic frequency control system of claim 11 wherein the detector means is comprised of a diode detector pair, which pair is subject to rectification efficiency changes resulting in a change in the output DC level from the detector means.

13. The automatic frequency control system of claim 11 wherein the resonate circuit means is comprised of a transmission type resonator.

14. The automatic frequency control system of claim 11 wherein the resonate circuit means is comprised of a reflection type resonator.

* * * * *